United States Patent [19]

Sato et al.

[11] Patent Number: 5,511,930

[45] Date of Patent: Apr. 30, 1996

[54] PRECISION POSITIONING APPARATUS

[75] Inventors: Mikio Sato, Kawasaki; Katsumi Asada, Yokohama; Shinji Wakui, Kawasaki, all of Japan

[73] Assignee: Canon Kabushiki Kaisha, Tokyo, Japan

[21] Appl. No.: 24,473

[22] Filed: Mar. 1, 1993

[30] Foreign Application Priority Data

Mar. 2, 1992 [JP] Japan .................................. 4-078756
Jan. 22, 1993 [JP] Japan .................................. 5-025980

[51] Int. Cl.$^6$ .................................................. G01M 7/00
[52] U.S. Cl. .......................... 414/676; 364/508; 356/358; 356/363
[58] Field of Search .................................. 414/936, 676; 356/358, 383; 364/508

[56] References Cited

U.S. PATENT DOCUMENTS

| 3,658,425 | 4/1972 | Bird et al. ................................. 356/363 |
| 3,692,413 | 4/1972 | Marcy et al. ............................. 356/358 |
| 3,715,599 | 2/1973 | Marcy ........................................ 356/363 |
| 4,311,390 | 1/1982 | Phillips ..................................... 356/358 |
| 4,585,379 | 4/1986 | Nagayama et al. ..................... 356/358 |
| 4,659,227 | 4/1987 | Sato et al. ................................. 356/401 |
| 4,676,649 | 6/1987 | Phillips ..................................... 356/358 |
| 4,708,481 | 11/1987 | Mori et al. ................................. 356/363 |
| 4,870,288 | 9/1989 | Abuku et al. ............................ 250/548 |
| 4,956,789 | 9/1990 | Hamada et al. ........................ 364/508 |
| 5,062,712 | 11/1991 | Sokuta et al. ............................ 356/358 |
| 5,073,912 | 12/1991 | Kobayashi et al. ..................... 414/936 |
| 5,109,148 | 4/1992 | Fujita et al. ........................ 219/121.82 |
| 5,114,234 | 5/1992 | Otsuka et al. ........................... 356/363 |

FOREIGN PATENT DOCUMENTS

| 0321579 | 6/1989 | European Pat. Off. . |
| 0387224 | 9/1990 | European Pat. Off. . |
| 2155252 | 6/1990 | Japan ..................................... 414/936 |
| 4139854 | 5/1992 | Japan ..................................... 414/936 |
| 2238406 | 5/1991 | United Kingdom . |

OTHER PUBLICATIONS

Kinoshita, et al., "Air Bearing Guided High Speed X–Y Stage," Japanese Society for Precision Engineering, vol. 52, No. 10, 1986, pp. 47 through 52.

Primary Examiner—Michael S. Huppert
Assistant Examiner—Gregory A. Morse
Attorney, Agent, or Firm—Fitzpatrick, Cella, Harper & Scinto

[57] ABSTRACT

A precision positioning apparatus suitable for the positioning control system of a semiconductor exposing apparatus such as a stepper has, as its object, the provision of a non-contact type precision positioning apparatus capable of properly correcting the disturbance of posture or vibration based on low rigidityy which is a feature of a non-contact guide mechanism and accomplishing stable, highly accurate positioning at a high speed. The precision positioning apparatus is provided with a base plate, a movable member positioned on the base plate, a driving device for driving the movable member, a detecting device for detecting movement of the movable member, and a device for supplying the driving device with a signal regarding the movement of the movable member on the basis of a reference value and the output value from the detecting device. The supplying device includes a device for forming a correction signal for substantially negating a disturbance force to the movable member, by the use of the signal supplied to the driving device and the output from the detecting device. The signal supplied to the driving device can be corrected by the correction signal.

6 Claims, 12 Drawing Sheets

DISTURBANCE OBSERVER

PRECISION POSITIONING APPARATUS

BACKGROUND OF THE INVENTION

1. Field of the Invention

This invention relates to a precision positioning apparatus, and particularly to a precision positioning apparatus suitable for a positioning control system for a semiconductor exposing apparatus such as a stepper.

2. Related Background Art

In a precision positioning apparatus, and particularly the positioning of the wafer stage of a stepper, the positioning accuracy required is becoming higher with the recent and rapidly increasing degree of integration of semiconductive elements. The present day positioning accuracy at a practical level is on the order of several tens of nanometers for a stage carrying thereon a wafer to be positioned, but positioning accuracy on the order of one nanometer is expected to become necessary in the near future. In order to improve throughput, it is necessary to effect such highly accurate positioning at a higher speed.

Taking a stepper as an example, most of such positioning apparatuses according to the prior art have used a slide guide or a rolling guide as guide means for a stage which is a conveying body, and a system for converting the revolution of a DC servomotor into rectilinear movement through a ball screw has been used as driving means.

However, higher positioning accuracy results in a significant increase in friction and therefore, if a higher speed and higher accuracy are contrived by the use of such a contact type construction, the problem of long-term stability by frictional abrasion or frictional heat and the problems of unstable behavior such as a stick slip phenomenon and jumping phenomenon will arise and positioning accuracy on the order of one nanometer will be difficult.

So, in order to solve such problems, a stage of the non-contact driving type which uses an air bearing as a guide surface from its advantage of being free from the influence of contact friction and in which a linear motor having this air bearing as a guide is used as driving means has recently become the mainstream.

However, in a positioning apparatus using such an air bearing and such a linear motor, the rigidity in the direction of movement of the stage is lower than the rigidity by a contact type guide mechanism and a ball screw. Accordingly, a base plate and the stage operate as a kind of coupled vibration system of two degrees of freedom and therefore, vibration is caused between the stage and the guide surface by the rolling of the base plate resulting from the movement reaction force of the stage and the positioning time for the stage increases. Heretofore, use has chiefly been made of a base plate acceleration feedback method in which an acceleration sensor is attached to a base plate and the acceleration signal of the base plate detected thereby is added to the control input of a linear motor (see, for example, Hiroo Kinoshita, Munetsugu Kanai, Kokichi Deguchi and Tadao Saito (Kinoshita, et al.): "Air Bearing Guided High-Speed XY Stage", the Journal of the Precision Engineering Society, 52/10 (1986), p. 47 through 52.

Also, as compared with the prior-art contact type guide mechanism, the rigidity of the above-described apparatus is low and therefore, the disturbance of the postures such as yawing and pitching other than translation motion is great and such movement, like the vibration of the base plate, becomes the cause of the aggravation of positioning accuracy and an increased positioning time. However, the prior-art fixed table acceleration feedback has suffered from the problem that it can hardly correct such disturbance of the postures.

SUMMARY OF THE INVENTION

The present invention has been made in view of the above-noted problems peculiar to the prior art and the object thereof is to provide a non-contact type precision positioning apparatus which can properly correct the disturbance of posture and vibration based on low rigidity which is a feature of a non-contact guide mechanism and can accomplish stable, highly accurate positioning with a high speed.

The precision positioning apparatus of the present invention is provided with a base plate, a movable member positioned on said base plate, driving means for driving said movable member, detecting means for detecting the moved state of said movable member, and means for supplying said driving means with a signal regarding the movement of said movable member on the basis of a reference value and the output value from said detecting means, said supplying means being provided with means for forming a correction signal for substantially negating a disturbance force to said movable member, by the use of the signal supplied to said driving means and the output from said detecting means, the signal supplied to said driving means being corrected by said correction signal.

A preferred form of the precision positioning apparatus of the present invention is provided with a base plate, a shock absorbing device for supporting said base plate, a non-contact guide of e.g. the air type provided on said base plate, a movable member to be positioned movable along said guide on said base plate, driving means for driving said movable member, detecting means for detecting at least one dynamic state such as displacement (position, velocity, etc.) of said movable member, and means for supplying said driving means with a signal regarding the movement of said movable member on the basis of a reference value and a value indicated by the output from said detecting means, said supplying means being provided with means for forming a correction signal for substantially negating a disturbance force to said movable member, by the use of the signal supplied to said driving means and the output from said detecting means, the signal supplied to said driving means being corrected by said correction signal.

In one form of the precision positioning apparatus of the present invention, said movable member includes a first movable portion movable on said base plate and a second movable portion having its posture changeable on said first movable portion, said driving means is provided with a first driving portion for translating said first movable portion and a second driving portion for changing the posture of said second movable portion, said detecting means is provided with a first detecting portion for detecting the amount of translation movement of said first movable portion and a second detecting portion for detecting the posture of said second movable portion, and said supplying means is provided with a first control portion for supplying said first driving portion with a first signal regarding the translation movement of said first movable portion on the basis of the reference value of position and the output value from said first detecting portion, and a second control portion for supplying said second driving portion with a second signal regarding the posture of said second movable portion on the basis of the reference value of posture and the output value from said second detecting portion.

Particularly in said one form, said forming means of said supplying means may be one which forms said correction signal by the use of the signal supplied to said first driving portion and the outputs from said first and second detecting portions, one which forms said correction signal by the use of the signals supplied to said first and second driving portions and the output from said first detecting portion, or one which forms said correction signal by the use of the signals supplied to said first and second driving portions and the outputs from said first and second detecting portions, and said supplying means may be one which forms said correction signal by taking into account the dynamic characteristic of a posture control system which is constituted by said second driving portion, said second detecting portion and said second control portion.

Any of the above-described various forms of the present invention is applied to an exposing apparatus for manufacturing semiconductive memories, liquid crystal panels, CCDs, magnetic heads, etc. which is provided with various stages for supporting thereon a member to be exposed such as a wafer, as said movable member.

Various features and other various forms of the present invention will become apparent from some embodiments of the invention which will hereinafter be described.

DETAILED DESCRIPTION OF THE PREFERRED EMBODIMENTS

In a first form of the present invention, provision is made of first control means for producing a first control command from the positional information or other states of a conveying body (a moving body) by measuring means such as a laser interferometer, and in addition, second control means, namely, a so-called "disturbance observer", for estimating, from the positional information or other states of the conveying body by said measuring means and control commands produced by the first and second control means, a disturbance force creating the vibration of the conveying body attributable to the rolling of a base plate resulting from the movement reaction force of the conveying body, or the disturbance of other posture such as the yawing or pitching of the conveying body than the translation movement thereof, thereby effectively suppressing the vibration of the conveying body attributable to the rolling of the base plate resulting from the movement reaction force of the conveying body, or the disturbance of posture such as the yawing or pitching of the conveying body other than the translation movement thereof, and enabling improved positioning accuracy and the shortening of the positioning time to be achieved.

According to the above-described construction, by applying the disturbance observer to a positioning apparatus, the vibration between the conveying body and a guide surface caused by the rolling of the base plate resulting from the movement reaction force of the conveying body as previously described can be detected as a "disturbance" and be eliminated.

The disturbance observer has been adopted in the control of a motor, a robot or the like in recent years. This technique foresees the disturbance of torque or thrust from a control voltage to a motor and the actual speed of the motor and compensates for it.

The compensation for disturbance by the disturbance observer will now be described with respect to the case of motor control as an example.

Figure 3:
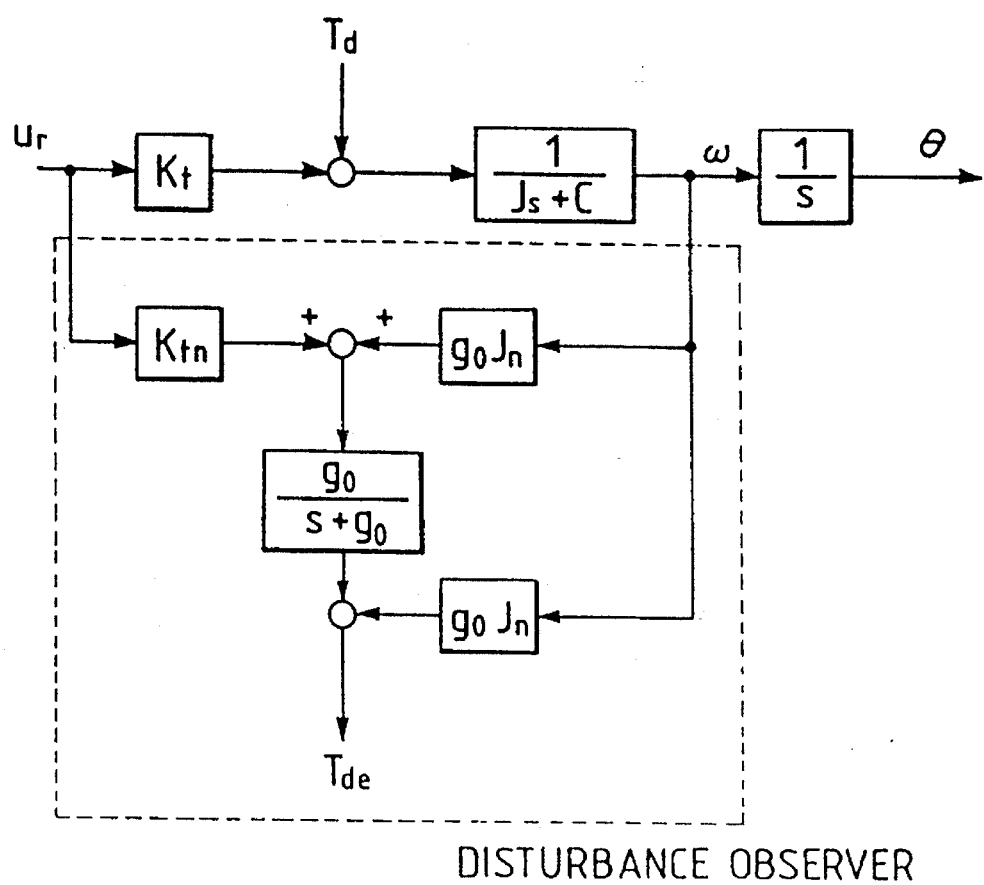
FIG. 3 is a block diagram of the motor and a disturbance observer.

FIG. 3 shows an equivalent circuit representing the relation from the command voltage $U_r$ of a motor to the angle of rotation $\theta$ thereof. At this time, in addition to the disturbance from the outside, deviation of a torque constant $K_t$ from the nominal value $K_{tn}$, and deviation of inertia $J$ from the nominal value $J_n$, and torque ripple or the like are present in the system and aggravate the positioning characteristic and therefore, these are collectively defined as $T_d$. The once differentiated value of $T_d$ is assumed as $$\dot{T}_d(=dT_d/dt)=0$$

and if a state equation is derived by a vector and a matrix, it will be expressed as the following mathematical expression (see, for example, Kohei Onishi: "The Control of the Electric Motor and Robot", the Journal of the Electric Society, 110/8 (1990), 657):

$$\dot{X}=AX+Bu$$
$$Y=CX \qquad (1)$$

where $$X = \begin{pmatrix} T_d \\ \omega \end{pmatrix}, \quad Y = \omega$$

$$A = \begin{pmatrix} 0 & 0 \\ -1/J_n & 0 \end{pmatrix}, \quad B = \begin{pmatrix} 0 \\ K_{tn}/J_n \end{pmatrix} \quad (2)$$

$$C = (0\ 1), \quad u = U_r$$

When the well-known Gopinath's minimum dimension observer constructing method is applied to this to find the estimated value $T_{de}$ of the disturbance torque $T_d$ from the input u and the amount of state $\omega$, an estimated value represented by the following equation is obtained by the use of a pole $g_0$ (rad/sec) which can be arbitrary, the observer has:

$$T_{de} = \frac{g_0}{s + g_0} (K_{tn} - J_n s\omega) \quad (3)$$

In equation (3), the parentheses are equal to the disturbance torque Td, and equation (3) can be rewritten into the following mathematical expression:

$$T_{de} = \frac{g_0}{s + g_0} T_d \quad (4)$$

Figure 2:
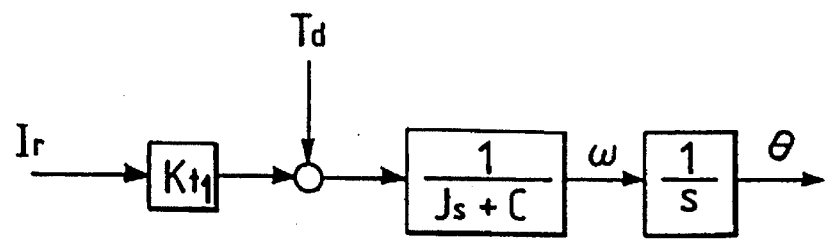
FIG. 2 is a block diagram showing the command value to the angle of rotation of a motor.

Thus, the disturbance observer estimates the torque disturbance $T_d$ with a first-order lag. Equation (3) can be expressed by a block diagram as shown in the dotted line of FIG. 3. This is then converted into a voltage value and superposed on the voltage command value $U_r$, thereby compensating for the influence of the torque disturbance $T_d$. In FIGS. 2 and 3, $U_r$ is a command voltage, $K_t$ is a torque constant, $K_{tn}$ is the nominal value of the torque constant, J is inertia, $J_n$ is the nominal value of the inertia, C is viscosity, $g_0$ is an observer gain, s is a differential operator, $\omega$ is an angular velocity, and $\theta$ is an angle.

Like this, in the disturbance observer, the information of disturbance is detected at the level of a torque or a force and corrected and therefore, as compared with the construction of the prior-art PID controller which uses only a series compensator, it is a great feature that a high disturbance eliminating ability is obtained. This disturbance observer has heretofore been used chiefly for the purpose of estimating a torque fluctuation resulting from the fluctuation of torque ripple or inertia or a torque disturbance received from the outside in the control or the like of a motor, a robot or a machine tool, and compensating for this.

However, there has not yet been reported any example in which this disturbance observer is applied to the precision positioning control of a non-contact conveying body carried on a fixed table like a stepper.

Accordingly, the effectiveness of the disturbance observer for the vibration of a conveying body by the rolling of a base plate and the disturbance of the posture of the conveying body such as yawing or pitching other than translational movement, which are the problems to be overcome by the present invention has not heretofore been made clear, and any application intended to overcome such problems has never been carried out.

Figure 4:
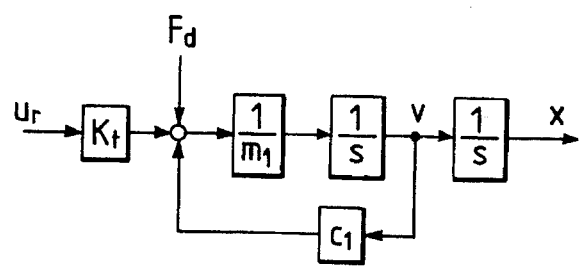
FIG. 4 is a block diagram showing the command value to the displacement of a linear motor.
Figure 5:
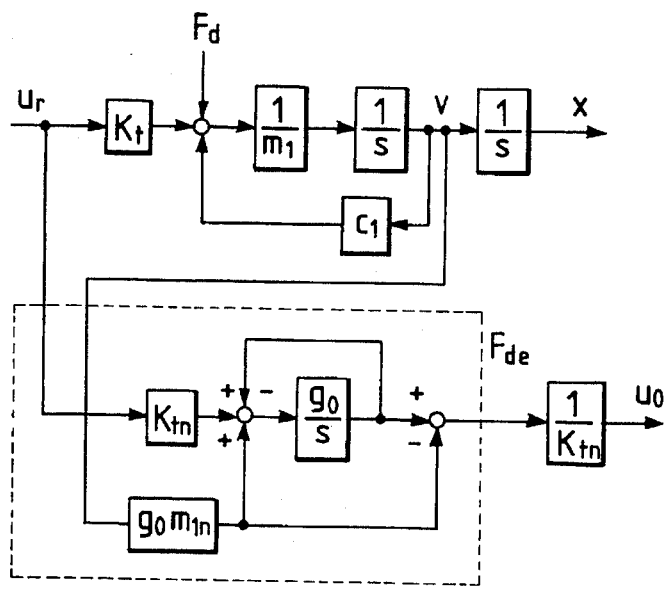
FIG. 5 is a block diagram of the linear motor and the disturbance observer.

FIG. 4 shows an equivalent circuit showing the relations of the command voltage $U_r$ to the displacement $x_1$ of the linear motor of the present invention when it is used. FIG. 4 is a diagram in which, relative to the circuit of FIG. 2, the command current $I_r$ is substituted for by a command voltage $U_r$, the angle of rotation $\theta$ is substituted for by displacement $x_x$, the torque constant $K_{tl}$ is substituted for by a thrust constant $K_t$, the inertia J is substituted for by inertia $m_1$, the disturbance torque $T_d$ is substituted for by a disturbance force $F_d$, the angular velocity $\omega$ is substituted for by a velocity v, and the viscosity constant C is substituted for by a constant $C_1$ and more or less equivalent conversion is applied. FIG. 5 is a diagram in which the disturbance observer is combined with the linear motor of FIG. 4.

Figure 6:
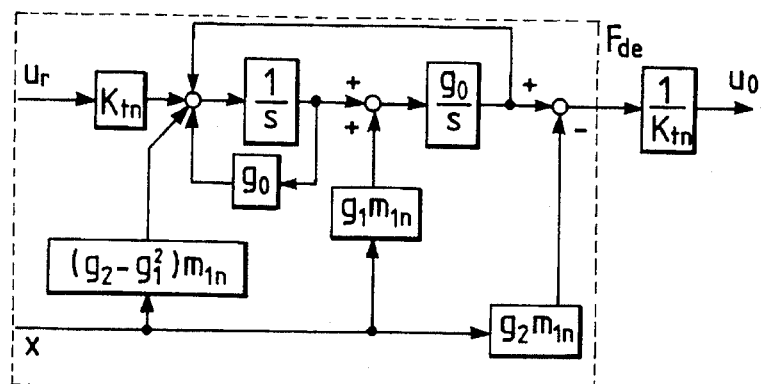
FIG. 6 is a block diagram of a disturbance observer using positional information.

In the foregoing, there has been shown an example in which the velocities $\omega$ and v are used as the states to construct the disturbance observer, but positional information $\theta$ or $x_1$ can also be used to construct the disturbance observer likewise. FIG. 6 shows an example in which a disturbance observer constructed by the use of the positional information $x_1$ is applied to the linear motor of FIG. 4. The basic concept is similar to the case where velocity information is used, but where the positional information is used, disturbance is estimated with a second-order lag, and the pole of the then observer, with $g_1$ and $g_2$ as parameters, is given by the two roots when the right side of the following equation is zero:

$$L(s) = s^2 + g_1 s + g_2 \quad (5)$$

Which of the observers of these two types should be used can be chosen with an observable state taken into account.

As described above, according to the first form of the present invention, provision is made of first control means for producing a first control input from the positional information or the other state of the conveying body by measuring means such as a laser interferometer, detecting means for detecting the positional information or the other state of the conveying body by said measuring means, and second control means, namely, a disturbance observer, for estimating, from a control input produced by the first and second control means, a disturbance force creating the vibration of the conveying body attributable to the rolling of the base plate resulting from the movement reaction force of the conveying body, or the disturbance of posture such as the yawing or pitching of the conveying body other than the translation movement thereof, and producing a second control input for negating it, thereby effectively suppressing the vibration of the conveying body attributable to the rolling of the base plate resulting from the movement reaction force of the conveying body, or the disturbance of posture such as the yawing or pitching of the conveying body other than the translation movement thereof, and enabling improved positioning accuracy and the shortening of the positioning time to be achieved.

In a stepper, in addition to the positioning of a wafer, it is necessary to effect the correction of the posture of the water for applying exposure light to the surface of the wafer (imaging a mask) without any inclination, and the stepper must be able to cope with a case where, due to the warp of the wafer, the surface of the wafer has an inclination with respect to a stage. So, posture control is first effected by stage posture detecting means and posture correction driving means so that the stage may be kept in a predetermined posture during the translation positioning operation. After the termination of the translation positioning operation, the inclination of the wafer surface itself is measured and the posture of the stage is corrected so that the imaging surface of the mask and the wafer surface may coincide with each other and the exposure light may be incident on the wafer without any inclination.

However, problems as will hereinafter be described have been encountered in applying the aforedescribed disturbance observer to a positioning apparatus like a stepper having posture correcting means in addition to the translation operating means.

First, by the application of the aforedescribed disturbance observer, the influence of the rolling of the base plate can be eliminated, but the amount of translated state of the stage is varied by the stage posture correcting operation performed after the positioning in the direction of translation of the stage and the estimated disturbance waveform of the disturbance observer is disturbed. This has led to the problem that the positioning characteristic is aggravated more than when the disturbance observer is not used.

Further, during the translation movement, as previously described, the posture control system is performing the regulating operation so as to keep the posture of the stage constant, but when viewed from the translation control loop, this posture control system becomes a kind of additional high-order resonance element. This has led to the problem that even if the disturbance observer is applied to such a positioning apparatus, the loop gain of the observer cannot be increased and a desired disturbance suppressing characteristic cannot be obtained.

In a second form of the present invention, there is provided a precision positioning apparatus carried on a base plate and having translation moving means and posture correcting means and which is suitable for practical use in terms of cost and strength and which properly corrects the disturbance of posture and vibration based on low rigidity which is a feature of a non-contact guide mechanism and can accomplish stable and highly accurate positioning with a high speed.

That is, the second form of the present invention is a positioning apparatus carried on a base plate and having translation moving means and posture correcting means and which is provided with first control means for outputting a first command signal to translation driving means on the basis of the output from measuring means for measuring the amount of state of translation movement and a translation reference value, third control means for posture control outputting a command signal to posture driving means on the basis of the output from posture measuring means and a posture reference value, and second control means, namely, a so-called "disturbance observer", for calculating a disturbance to a stage on the basis of the output from the measuring means for measuring the state of translation movement and an input signal to the translation driving means and outputting a second command signal for negating the disturbance, and adds the first command signal and the second command signal together to provide an input signal to the translation driving means, thereby detecting and eliminating the vibration between the stage and a guide surface by the rolling of the fixed table as a "disturbance". At this time, the influence of the posture correcting means upon the disturbance observer is eliminated by modifying means for the input of the translation state of the disturbance observer which modifying means constitutes first modifying means and uses a control command value for the correction of the posture of the stage and/or the posture information from the posture measuring means, and/or modifying means for the output of the disturbance observer which modifying means constitutes second modifying means and takes the dynamic characteristic of a posture correcting control system into account.

Thus, in the positioning apparatus having the posture correcting means, the vibration between the stage and the guide surface attributable to the rolling of the base plate resulting from the movement of the stage is detected and eliminated as a "disturbance", thereby realizing a positioning characteristic of high performance.

Figure 1:
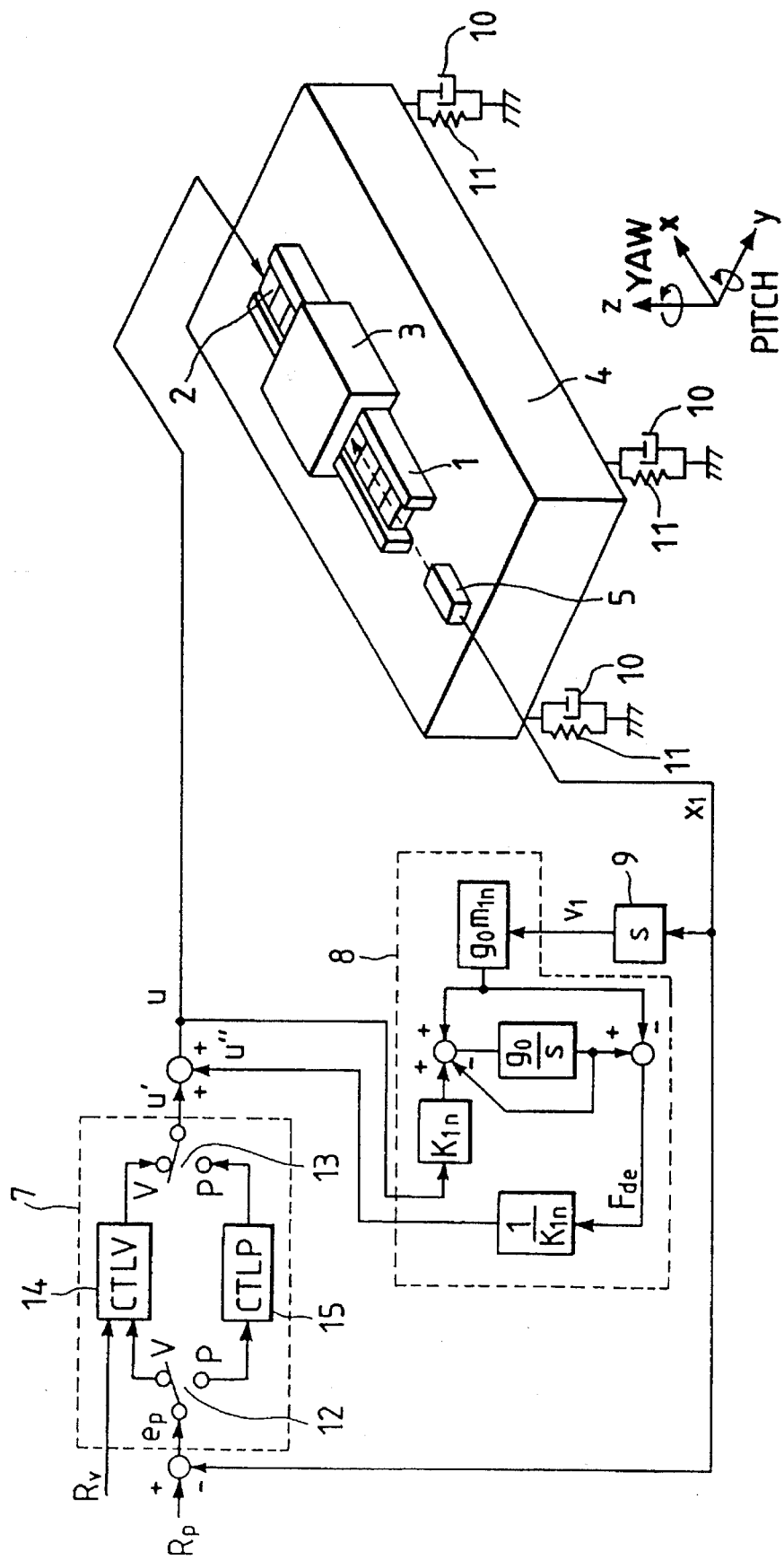
FIG. 1 shows the construction of a non-contact type precision positioning apparatus according to an embodiment of the present invention.

FIG. 1 is a schematic diagram of a precision positioning apparatus according to an embodiment of the present invention. In FIG. 1, the reference numeral 1 designates non-contact guide means such as an air bearing, the reference numeral 2 denotes a linear motor which is driving means, the reference numeral 3 designates a wafer stage as a conveying body which is driven by the linear motor 2 and on which a wafer is placed, the reference numeral 4 denotes a base plate, the reference numeral 5 designates position measuring means for measuring a position or displacement amount of the conveying body, such as a laser interferometer, the reference numeral 7 denotes first control means, and the reference numeral 8 designates second control means for estimating a disturbance force, i.e., a disturbance observer. The reference numeral 9 denotes a differentiator, the reference numeral 10 designates a damper, the reference numeral 11 denotes a coil spring, the reference numerals 12 and 13 designate mode changeover switches, the reference numeral 14 denotes a speed mode series compensator, and the reference numeral 15 designates a position mode series compensator. Although not shown, such elements as a projection optical system, a mask stage and an illuminating system are provided above the wafer stage 3 in succession from the stage 3 side. The image of the circuit pattern of a mask on the mask stage is projected onto the wafer on the wafer stage 3 by the projection optical system and is transferred to the wafer, whereby a semiconductive device is made.

In the above-described construction, the first control means 7 changes over the speed control mode compensator 14 and the position control mode compensator 15 by the changeover switches 12 and 13 in conformity with the deviation $e_p$ between the displacement $x_1$ of the conveying body 3 relative to the base plate 4 obtained by the position detecting means 5 fixed on the base plate 4 and a target position $R_p$. The respective mode compensators are popular series compensators such as PIDs. A control command u which is the sum of the commands of the first control means 7 and the second control means 8 is supplied to the linear motor 2 fixed on the base plate 4, whereby a driving force is created. The base plate 4 is supported from the floor by the damper 10 and the coil spring 11.

The non-contact type guide means 1 is fixed on the base plate 4, and the conveying body 3 integral with the mover of the linear motor 2 floats by a minute amount relative to the guide means 1 and is moved in a non-contact fashion the x direction by said driving force with the aid of the linear motor 2 and the guide means 1. At this time, however, the vibration of the conveying body 3 attributable to the rolling of the base plate 4 resulting from the reaction force of the driving force, and the disturbance of posture such as the yawing (the rotation about the z-axis in FIG. 1) or the pitching (the rotation about the y-axis in FIG. 1) of the conveying body 3 other than translation movement occur and therefore, a long time will be required for positioning if only the first control means 7 is resorted to. The second control means 8 is provided to eliminate such an influence, and the positional information of the conveying body 3 obtained from the position measuring means 5 is differentiated by the differentiator 9 to obtain velocity information $v_1$, and by the use of this velocity information and a control command u, the estimated value $F_{de}$ of the disturbance force by at least one of the vibration, the pitching and rolling is found, and in order to compensate for this, a control amount u" is superposed on the output u' of the first control means 7.

Figure 7:
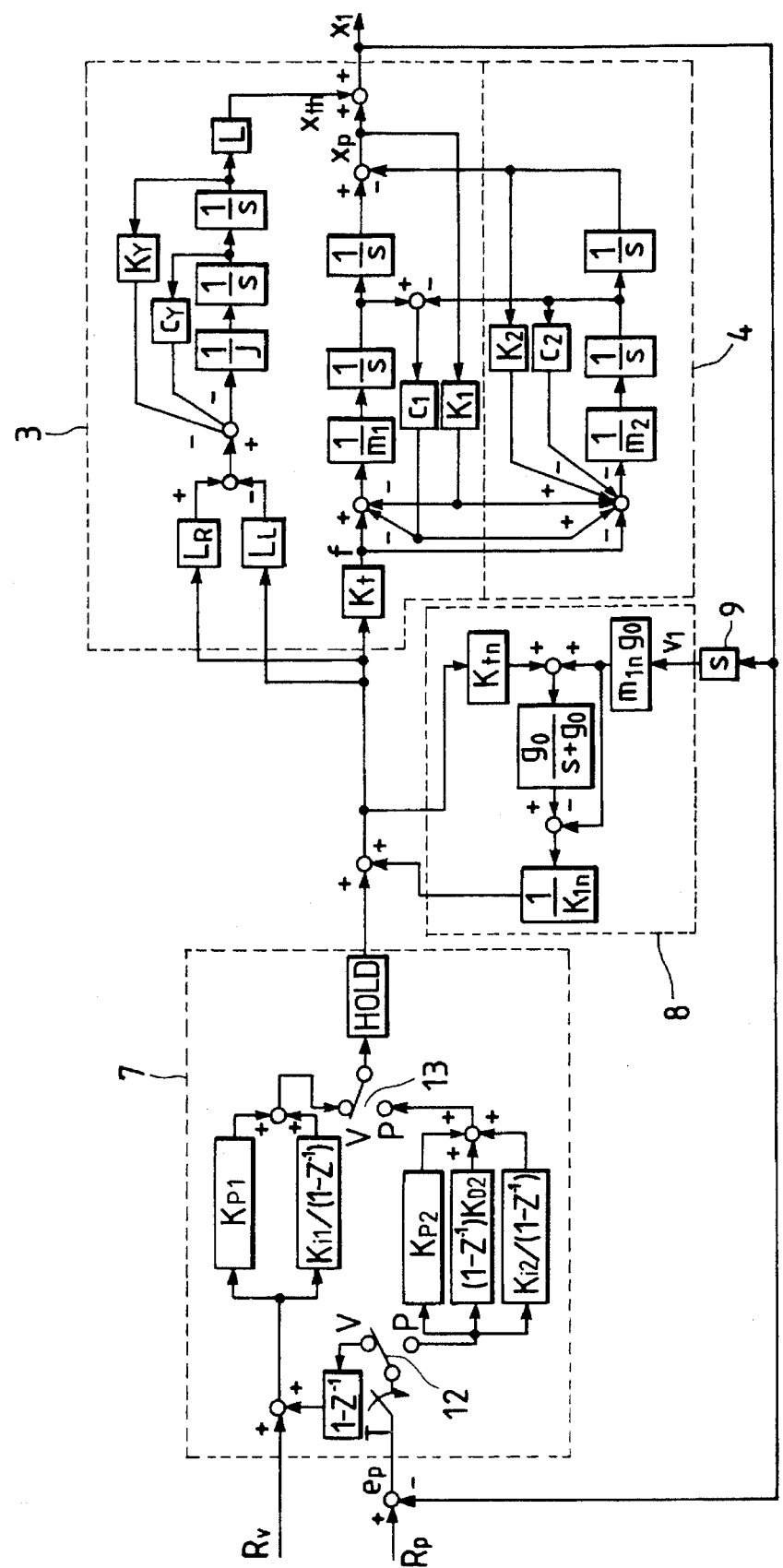
FIG. 7 is a block diagram of the apparatus of FIG. 1.

The effect of the present embodiment for the vibration of the base plate and rotational vibrations such as pitching and rolling will now be clearly shown by specific numerical analysis. First, the construction of FIG. 1 may be represented by a block diagram as shown in FIG. 7. In FIG. 7, the first control means 7 is shown as a digitally constructed block, and it effects PI compensation in the speed mode, and effects PID compensation in the position control mode. The non-contact type conveying body 3 and the base plate 4 which are the objects of control effect modeling as a compound system of two degrees of freedom, and the conveying body 3 takes the displacement $x_p$ by translation movement and in addition, the influence $x_{th}$ of yawing movement which, among rotational movements, particularly poses a problem, into account. In FIGS. 1 and 7, $R_v$ is a command speed, $R_p$ is a reference position, T is a sampling period $K_{p1}$ is a speed control mode proportional gain, $K_{i1}$ is a position control mode integrated gain, $K_{p2}$ is a speed control mode proportional gain, $K_{i2}$ is a position control mode integrated gain, $K_{D2}$ is a position control mode differential gain, $Z^{-1}$ is a lag operator, HOLD is a holder, s is a differential operator, $k_t$ is a linear motor thrust constant, $m_1$ is the mass of the conveying body, $k_{tn}$ is the nominal value of the linear motor thrust constant, $m_{1n}$ is the nominal value of the mass of the conveying body, $g_0$ is an observer gain $L_r$ is the length from the center of gravity of the conveying body to the right force acting point, $L_L$ is the length from the center of gravity of the conveying body to the left force acting point, L is the length from the center of gravity of the conveying body to the position measuring point, $m_2$ is the mass of the base plate, $c_1$, $c_2$ and $c_y$ are viscosity constants, $k_1$, $k_2$ and $k_y$ are spring constants, $x_{th}$ is the displacement in the x direction by pitching, $x_p$ is the displacement in the x direction by translation movement, and $x_1$ is the displacement of the conveying body measured by the position measuring means.

Figure 8A:
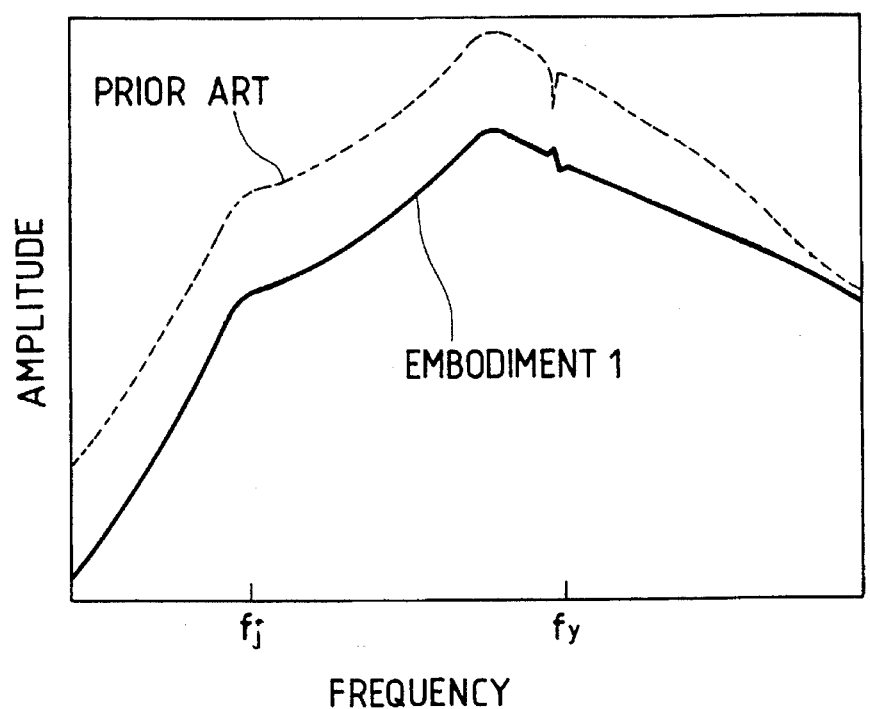
FIG. 8A and 8B are transfer characteristic graphs of a disturbance force applied to a base plate for the displacement of a conveying body, FIG. 8A being a response characteristic graph of amplitude as related to frequency and FIG. 8B being a response characteristic graph of phase as related to frequency.
Figure 8B:
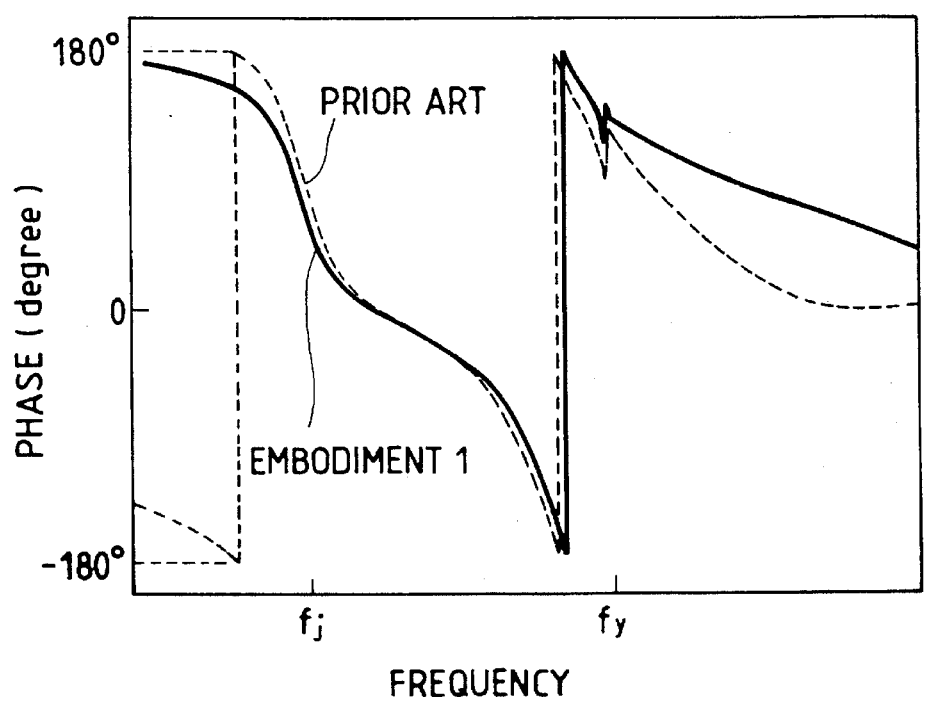

It is in the suppressing characteristic to disturbance that the superiority of the present embodiment over the prior-art base plate acceleration feedback appears most remarkably. So, with regard to the prior-art method and the present embodiment, the frequency characteristic (the characteristic in the position control mode) from the disturbance force applied to the base plate 4 for the displacement of the conveying body 3 is shown in FIGS. 8A and 8B. FIG. 8A shows the amptitude of response, and FIG. 8B shows the phase of response, and the dimension of amplitude is in compliance (displacement/force). As shown in FIGS. 8A and 8B, in the present embodiment, as compared with the method by the prior-art base plate acceleration feedback, the disturbance suppressing characteristic can be improved over the whole range including the vibration frequency $f_j$ of the base plate and the rotation frequency $f_y$ of the conveying body. Accordingly, this effect appears remarkably in the actual response waveform as well.

Figure 9A:
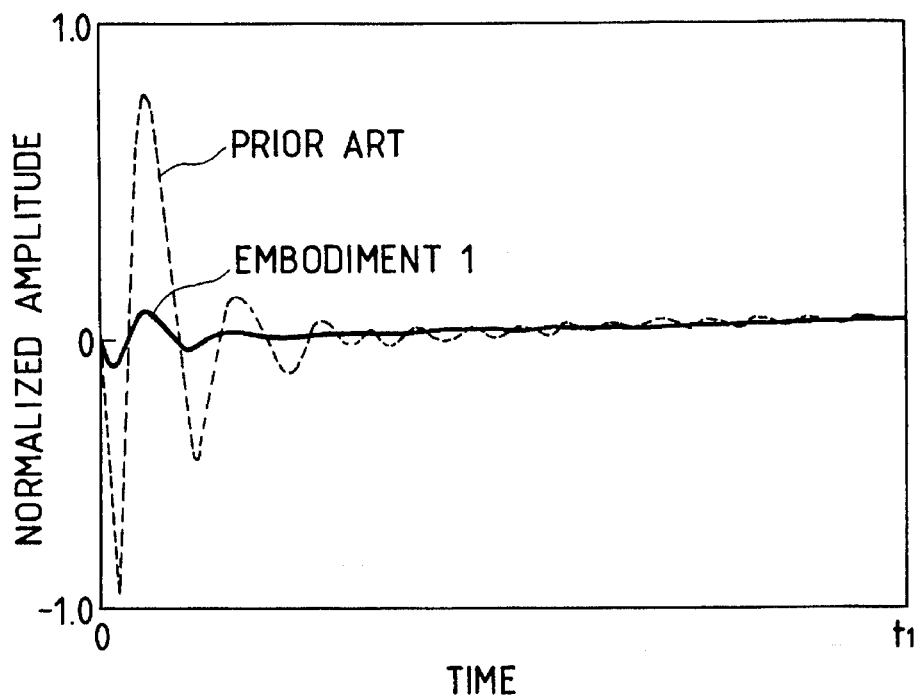
FIGS. 9A and 9B show the displacements of the conveying body when a unit step input is applied to the base plate at different times.
Figure 9B:
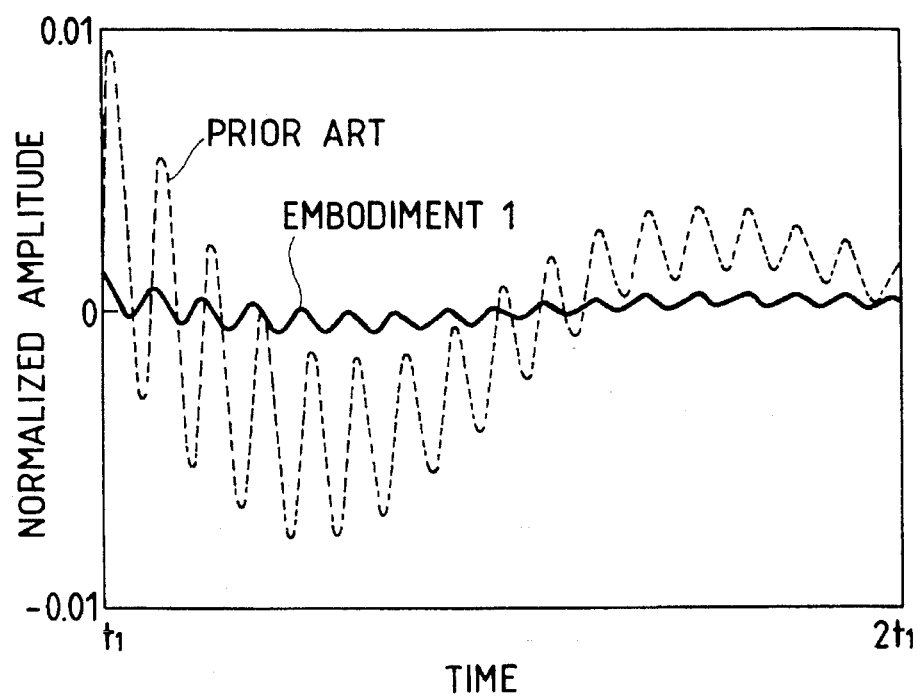

As an example, the displacement waveform of the conveying body to a unit step disturbance force applied to the fixed table is shown in FIGS. 9A and 9B. FIG. 9A shows the response until time $t_1$ for response to be settled in a certain predetermined range, and FIG. 9B shows the response from after the time $t_1$ until time $2t_1$, and the vertical axes of these figures represent the displacement $x_1$ of the conveying body 3 normalized by the same representative length. Vibration of a great period remarkably seen in the example of the prior art shown in FIG. 9B is the vibration of the conveying body by the rolling of the base plate 4, and vibration of a small period is the yawing vibration of the conveying body 3. As is apparent from FIGS. 9A and 9B, according to the present embodiment, the suppressing characteristic can be more greatly improved for the vibration of the conveying body 3 by the rolling of the base plate 4 and the pitching vibration of the conveying body 3 than by the prior-art base plate acceleration feedback.

Figure 10A:
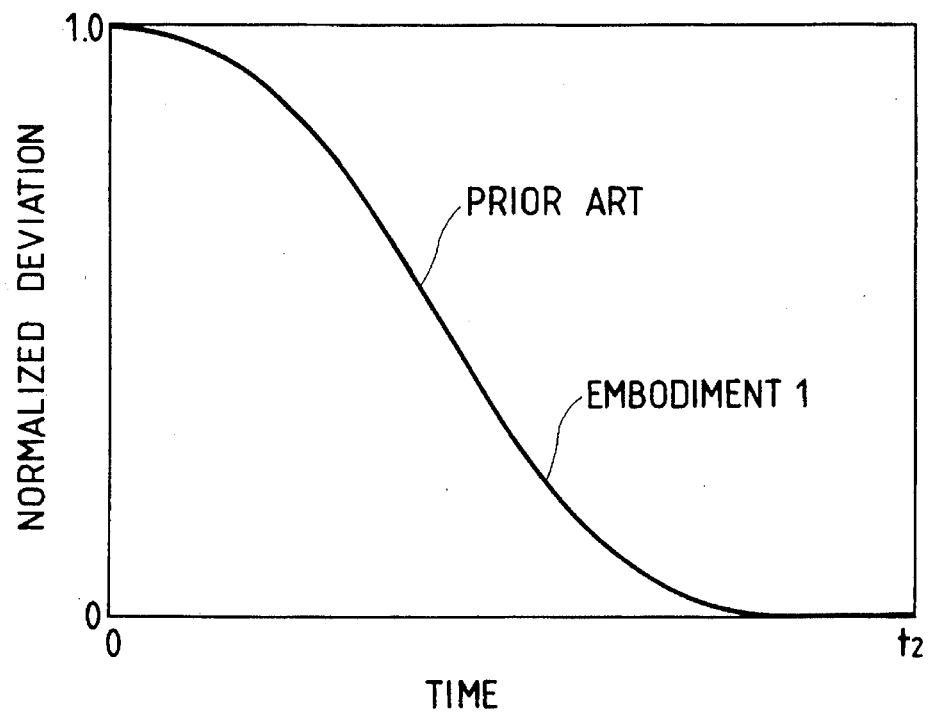
FIGS. 10A and 10B show the displacements of the conveying body when the conveying body is moved by a distance λ and positioned at different times.
Figure 10B:
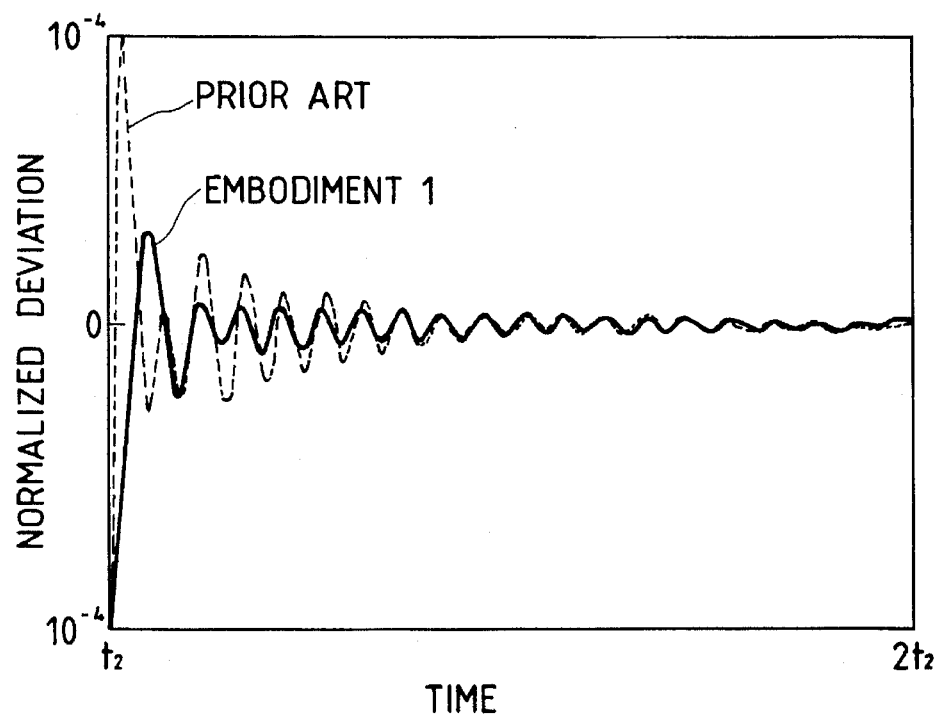

FIGS. 10A and 10B show the displacement of the conveying body 3 when the conveying body 3 is actually moved by a predetermined distance λ by the speed control mode and the position control mode and precisely positioned. FIG. 10A shows the state of the response until time $t_2$ when deviation is settled in a certain predetermined range, and FIG. 10B shows the state of the response from after the time $t_2$ until time $2t_2$, and the vertical axes in these figures represent values normalized by the movement distance λ. The rough state of the response shown in FIG. 10A differs very little from that in the prior-art method, but the response in the minute positioning area of FIG. 10B differs entirely from that in the prior-art method, and the response according to the present embodiment is better in convergence than that by the method using the prior-art base plate acceleration feedback method. This is true for the reasons previously described. According to the present embodiment, the suppressing characteristic for the vibration of the base plate and the rotational vibration of the conveying body is greatly improved. Thus, if precision positioning is effected by the present embodiment, improved positioning accuracy and shortened positioning time can be achieved as compared with the prior-art method.

In the embodiment shown in FIG. 1, the speed signal $v_1$ is found from the position signal obtained from the position detecting means, by the differentiator, and is used as the input of the second control means. However, by obtaining speed information from the state of the conveying body, or directly obtaining a speed signal by the use of a speed detector of the moving coil type or the like, it is also possible to carry out the present invention without departing from the embodiments discussed above. Also, the embodiment shown in FIG. 1 relates to a single-axis positioning apparatus, but the present invention can also be applied to a two-axis (or multi-axis) positioning apparatus like a stepper without departing from the embodiments discussed above.

Provision is made of control means, namely, a disturbance observer, for estimating a disturbance force causing the vibration of the conveying body 3 attributable to the rolling of the base plate 4 resulting from the movement reaction force of the conveying body 3, or the disturbance of posture such as the yawing or pitching of the conveying body 3 other than translational movement, and producing a control input negating this, whereby the vibration of the conveying body 3 attributable to the rolling of the base plate 4 resulting from the movement reaction of the conveying body 3, or the disturbance of posture such as the yawing or pitching vibration of the conveying body 3 other than translational movement is effectively suppressed and improved positioning accuracy and shortened positioning time become possible as compared with the method using the prior-art base plate acceleration feedback.

Figure 11:
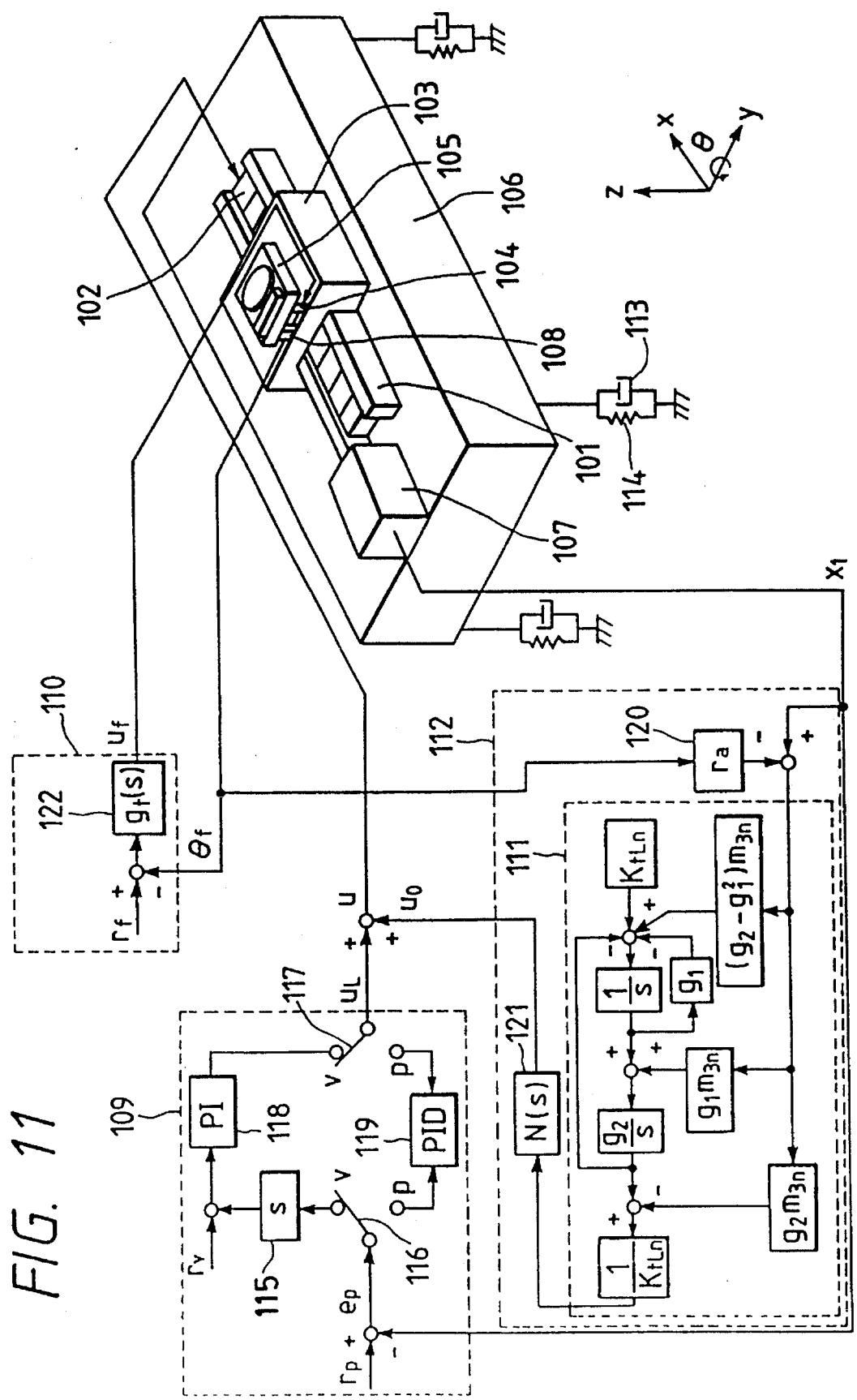
FIG. 11 shows the construction of a precision positioning apparatus according to another embodiment of the present invention.

FIG. 11 is a schematic diagram of a precision positioning apparatus according to another embodiment of the present invention in a stepper for the manufacture of various devices. The stepper originally has a structure capable of controlling all of the six degrees of freedom of a stage, but in the present embodiment, for simplicity, description will be made of a positioning apparatus having two degrees of freedom for measuring and controlling, in addition to one degree of freedom of translation in the x direction, the degree of freedom of rotation of the stage in the θ direction, as shown in FIG. 11. However, this simplification does not spoil the features of the present invention in any way.

Now, in FIG. 11, the reference numeral 101 designates guide means such as a static pressure bearing or an antifriction bearing, the reference numeral 102 denotes a linear motor which is translation driving means, the reference numeral 103 designates a coarse movement stage driven by the linear motor 102, the reference numeral 104 denotes posture correction driving means for effecting posture correction in the θ direction, the reference numeral 105 designates a fine movement stage driven by the posture correction driving means 104, the reference numeral 106 denotes a base plate, the reference numeral 107 designates a position measuring means for measuring the position in the direction of translation by a laser interferometer or the like, the reference numeral 108 denotes posture measuring means for measuring the posture of the fine movement stage 105, the reference numeral 109 designates first control means, the reference numeral 110 denotes third control means for posture correction, the reference numeral 111 designates second control means used in the first embodiment to estimate a disturbance, i.e., a disturbance observer similar to that shown in FIG. 1, the reference numeral 120 denotes first modifying means using the output of the posture measuring means 108, the reference numeral 121 designates second modifying means taking the dynamic characteristic of a posture correction control system into account, the reference numeral 112 denotes a disturbance observer provided with modifying means provided by the first modifying means 120 and the second modifying means 121, the reference numeral 113 designates a damper the reference numeral 114 denotes a spring, the reference numeral 115 designates a differentiator, the reference numerals 116 and 117 denote mode changeover switches, the reference numeral 118 designates a PI series compensator in the speed mode, the reference numeral 119 denotes a PID series compensator in the position mode, and the reference numeral 122 designates a series compensator in the third control means 110. The coarse movement stage 103, the fine movement stage 105 carried thereon, the posture correction driving means 104 and the posture measuring means 108 together are simply called a stage. Again in FIG. 11, by the use of an illuminating system, a mask stage and a projection optical system, all not shown, the image of the circuit pattern of a mask on the mask stage is projected and transferred onto a wafer on the stage 105.

In the above-described construction, the first control means 109 changes over the speed mode compensator 118 and the position control mode compensator 119 by the changeover switches 116 and 117 in conformity with the deviation $e_p$ between the displacement $X_1$ of the fine movement stage 105 relative to the base plate 106 obtained by the translation position detecting means 107 fixed to the base plate 106 and a target position $r_p$. The compensators in the respective modes are popular PI and PID series compensators. A command value $u_L$ to the linear motor 102 which is the translation driving means is calculated by the first control means 109.

Also, in the third control means 110, the difference between the inclination $\theta_f$ of the fine movement stage 105 detected by the posture measuring means 108 and a target value $r_f$ is delivered to the series compensator 122, whereby a command value $u_f$ to the posture correction driving means 104 is calculated.

On the other hand, a control command u is supplied to the linear motor 102 fixed to the base plate 106, and a thrust is created. The fixed table 106 is supported from a floor by the damper 113 and coil spring 114 for intercepting the vibration of the floor. Also, the guide means 101 is fixed to the base plate 106, and the entire stage including the coarse movement stage 103 integral with the movement of the linear motor 102 is guided by the guide means 101 and moved in the x direction.

However, if at this time, the vibration of the stage is caused by the positional deviation of the stage relative to the guide surface of the guide means 101 which is attributable to the rolling of the base plate 106 resulting from the driving reaction force of the linear motor 102 and the control of the linear motor 102 is effected by the first control means 109 alone (that is if $u=u_L$), a great time will be required for positioning.

In FIG. 11, the second control means 111 is estimating means for estimating a disturbance force by the disturbance observer shown in the aforedescribed embodiment, and in the second control means 111, a disturbance including positional deviation vibration attributable to the rolling of the base plate is estimated from stage position information obtained by the measuring means 107 and the command signal $u_o$ to the linear motor 102, and it is converted into a voltage and added to $u_L$. Here, $m_{3n}$ in the second control means 111 is the nominal value of the mass of the stage including the fine movement stage, i.e. $m_{1n}+m_{fn}$.

However, if the second control means 111 which is such a disturbance observer is intactly applied to a positioning apparatus having the posture correcting means 110, like a stepper, the influence of the posture correction of the fine movement stage 105 effected after the positioning in the direction of translation is superposed as a step-like disturbance on the stage position information detected by the position measuring means 107 and accordingly, affects the operation of the disturbance observer, and this may lead to the problem of an increased positioning time.

Further, such a mechanical resonance characteristic by the fine movement stage 105 and posture correction driving means 104 becomes a kind of additional high-order resonance to the second control means 111 which is the disturbance observer and therefore, the bandwidth of the observer cannot be set widely, and this also leads to the problem that a desired disturbance suppressing characteristic cannot be secured.

So, it is a feature of the present embodiment to provide first modifying means 120 and/or second modifying means 121 in a positioning apparatus having posture correcting means, and solve the above-noted two problems by a disturbance observer 112 provided with so-called modifying means for modifying the output of the second control means 111. The modifying means 120 is first modifying means for calculating the influence of any posture change of the fine movement stage 105 superposed on the position measuring means 107, from the inclination $\theta_f$ of the fine movement stage 105 by the posture measuring means 108, by a geometrical positional relation, and decreasing the amount of influence thereof. Also, the modifying means 121 is a filter for suppressing the resonance peak of the entire positioning system including a posture correction control system comprising the fine movement stage 105, the posture correction driving means 104 and the posture correction control means 22, with the dynamic characteristic of the posture correction control system taken into account, and a notch filter is generally employed as such filter. This filter serves to prevent the instability of the observer loop by the resonance of the posture correction control system which becomes a bottleneck in setting the bandwidth of the disturbance observer highly and enhancing the disturbance suppressing characteristic.

Thus, an estimate signal $u_o$ obtained by the second control means 111 which is the disturbance observer of the aforedescribed embodiment and the disturbance observer 112 provided with the so-called modifying means provided by the first modifying means 120 and the second modifying means 121 is added to the output $u_L$ of the first control means 109 to obtain a linear motor input u, thereby realizing a higher disturbance suppressing ability and eliminating the positional deviation vibration of the stage attributable to the rolling of the base plate.

Figure 12:
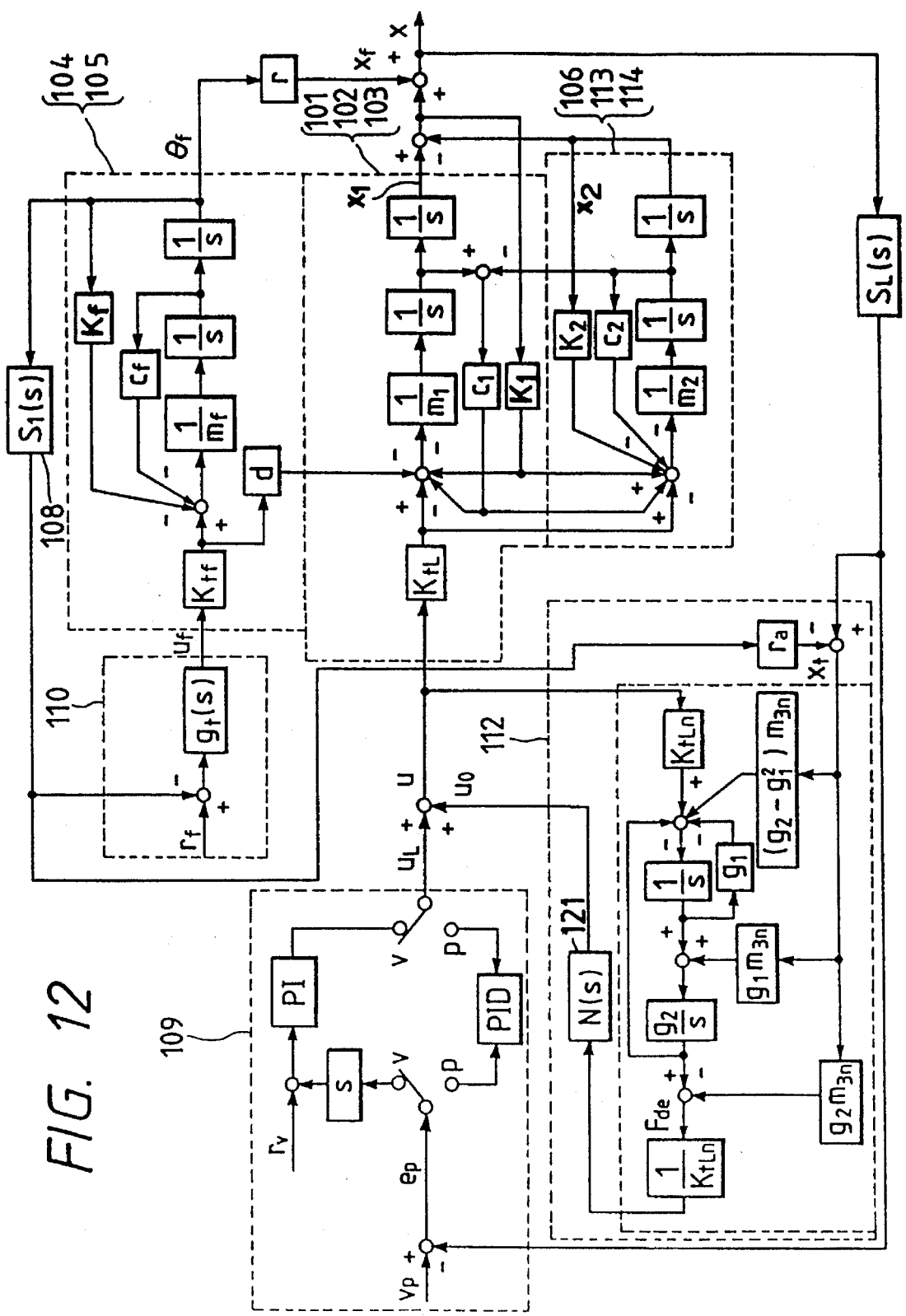
FIG. 12 is a block diagram of the apparatus of FIG. 11.

The effect of the present invention for the suppression of the positional deviation vibration of the stage attributable to the rolling of the base plate caused by the movement reaction force of the stage will now be clearly shown by specific numerical analysis. First, the construction of FIG. 11 can be shown by a block diagram as shown in FIG. 12. In FIG. 12, the fine movement stage 105, the coarse movement stage 103 and the base plate 106 are dealt with as a secondary vibration system.

Design is made such that the influence $x_f$ of the posture displacement $\theta_f$ of the fine movement stage 105 is added to positional information $x_1$ in the direction of translation through a coefficient r determined from a geometrical positional relation and at the same time, the reaction force of the posture correction driving means 114 is transmitted to the coarse movement stage 103 through a coefficient d also determined from the geometrical positional relation.

As the first modifying means 121, use is made of a notch filter which suppresses the resonance peak of the posture correction control system, and the transmission characteristic N(s) thereof is $$N(s) = \frac{s^2 + \omega_n^2}{s^2 + \omega_n Q s + \omega_n^2} \quad (6)$$

where $\omega_n$ is a notch frequency set to the resonance frequency of the fine movement stage control system.

In FIGS. 11 and 12, $r_p$ is a command position, $r_V$ is a command speed, $r_f$ is a command posture, s is a differential operator, $k_{iL}$ is a linear motor thrust constant, $k_{iLn}$ is the nominal value of the linear motor thrust constant, $m_1$ is the mass of the coarse movement stage, $m_{1n}$ (=$m_1$) is the nominal value of the mass of the coarse movement stage, $m_f$ is the mass of the fine movement stage, $m_{fn}$ is the nominal value of the mass of the fine movement stage, $m_{3n}$ is the nominal value ($m_{1n}+m_{fn}$) of the mass of the stage, $m_2$ is the mass of the fixed table, $m_{2n}$ is the nominal value of the mass of the fixed table, $c_1$, $c_2$ and $c_f$ are viscosity constants, $k_1$, $k_2$ and $k_f$ are spring constants, $x_1$ is stage displacement, $g_1$ and $g_2$ are observer gains, r is a gain constant, $u_L$, $u_O$ and u are linear motor command values, $\theta_f$ is an angle of rotation, and $u_f$ is a posture correction command value.

Figure 13A:
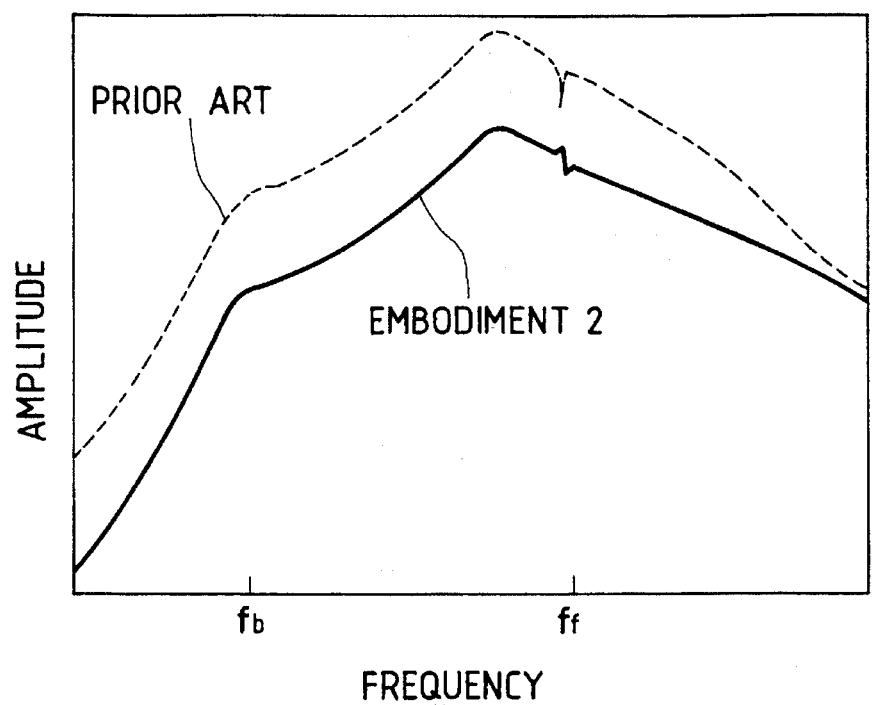
FIGS. 13A and 13B show the transfer characteristics of a disturbance force applied to a base plate for the displacement of a stage, FIG. 13A showing the response characteristic of amplitude as related to frequency, and FIG. 13B showing the response characteristic of phase as related to frequency.
Figure 13B:
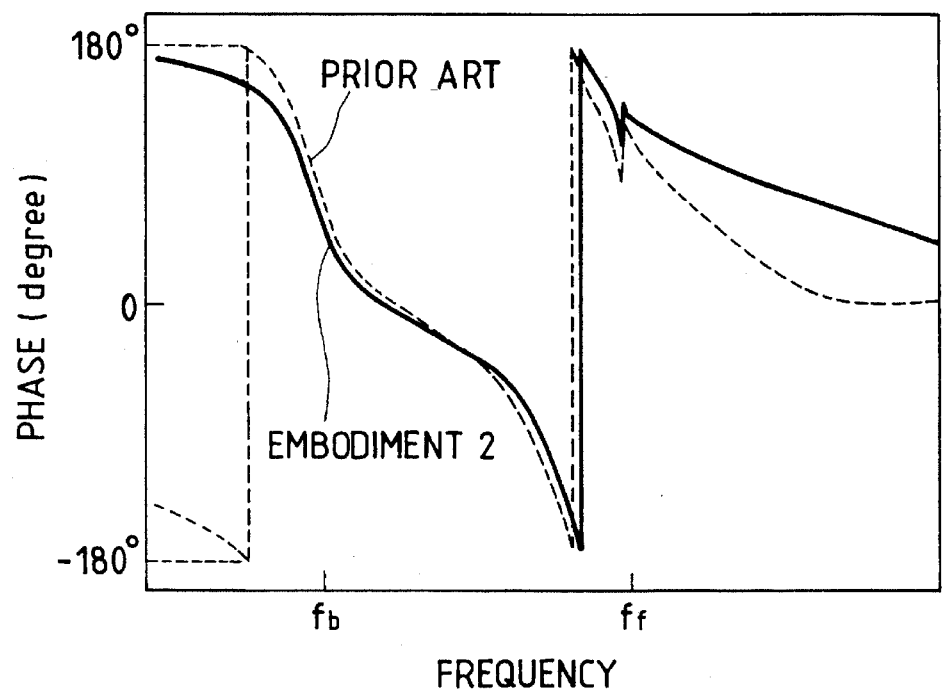

It is in the suppressing characteristic to disturbance that the superiority of the present embodiment appears most remarkably. So, the frequency characteristic from a disturbance force applied to the base plate 106 to the displacement of the stage when the prior-art base plate acceleration feedback is used and in the present embodiment is shown in FIGS. 13A and 13B. Incidentally, when the disturbance observer of the aforedescribed embodiment is used for the stage having a posture correction control system like that of the present embodiment, if the band of the observer is set to be equal to with the present embodiment, it will become unstable as previously described.

FIG. 13A shows the amplitude of response, and FIG. 13B shows the phase of response, and the dimension of the amplitude is in compliance (displacement/force). As seen in FIG. 13A, in the present embodiment, as compared with the method using the prior-art fixed table acceleration feedback, the disturbance suppressing characteristic can be improved over the whole range including the base plate vibration frequency $f_b$ and the resonance frequency $f_f$ of the posture correction control system. Accordingly, this effect appears remarkably in the actual time response waveform as well.

Figure 14A:
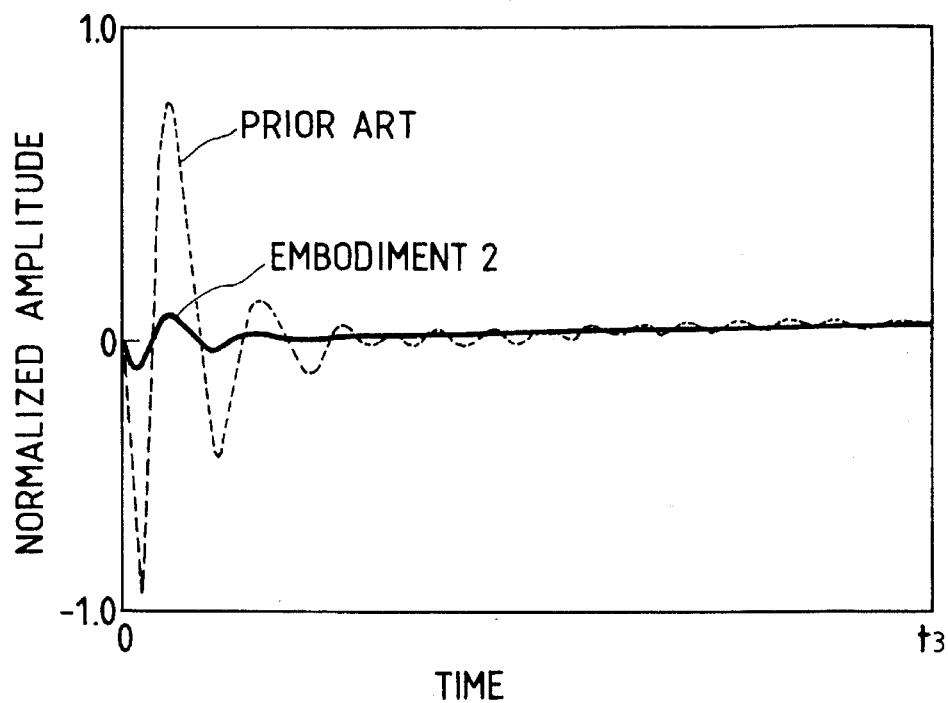
FIGS. 14A and 14B show the displacements of the stage when a unit step input is applied to the base plate at different times.
Figure 14B:
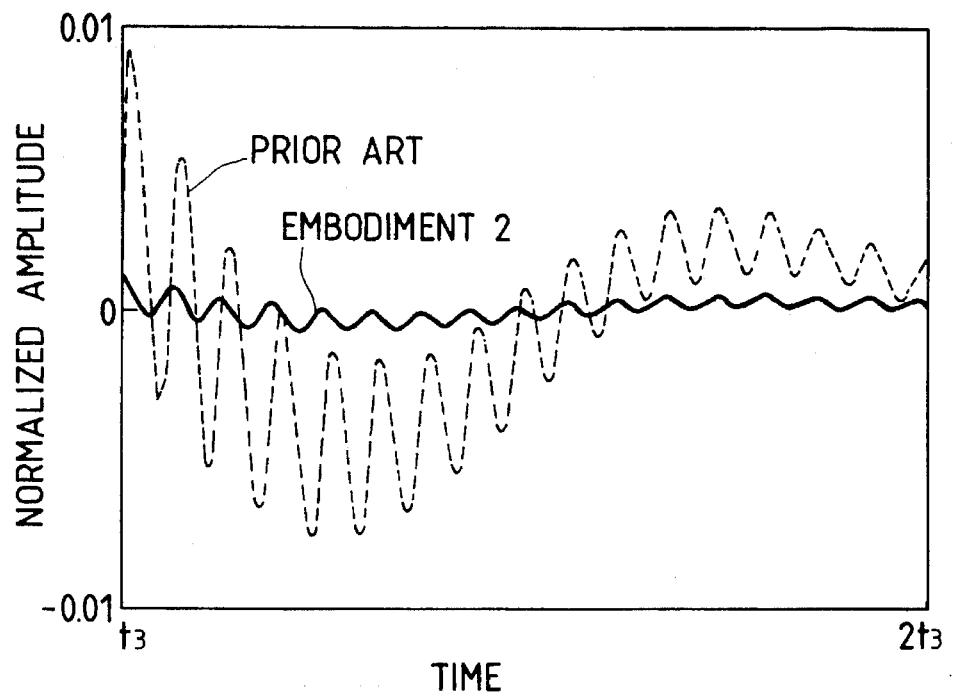

As an example, the displacement waveform of the stage for a unit step disturbance force applied to the base plate 106 is shown in FIGS. 14A and 14B. FIG. 14A shows the response until time $t_3$ for the response to be settled in a predetermined range, and FIG. 14B shows the response from the time $t_3$ until time $2t_3$. In these figures, the vertical axes represent normalized stage displacement $x_1/L$ normalized by the same representative length L. The vibration of a great cycle remarkably seen in the example of the prior art shown in FIG. 14B is the positional deviation vibration of the stage caused by the rolling of the base plate 106, and the vibration of a small cycle is the vibration by the influence of the fine movement stage control system. As is apparent from FIGS. 14A and 14B, according to the present embodiment, the supporting characteristic can be more greatly improved for the vibration of the stage caused by the rolling of the fixed table 106 and the vibration of the fine movement stage control system than by the prior-art base plate acceleration feedback.

Figure 15A:
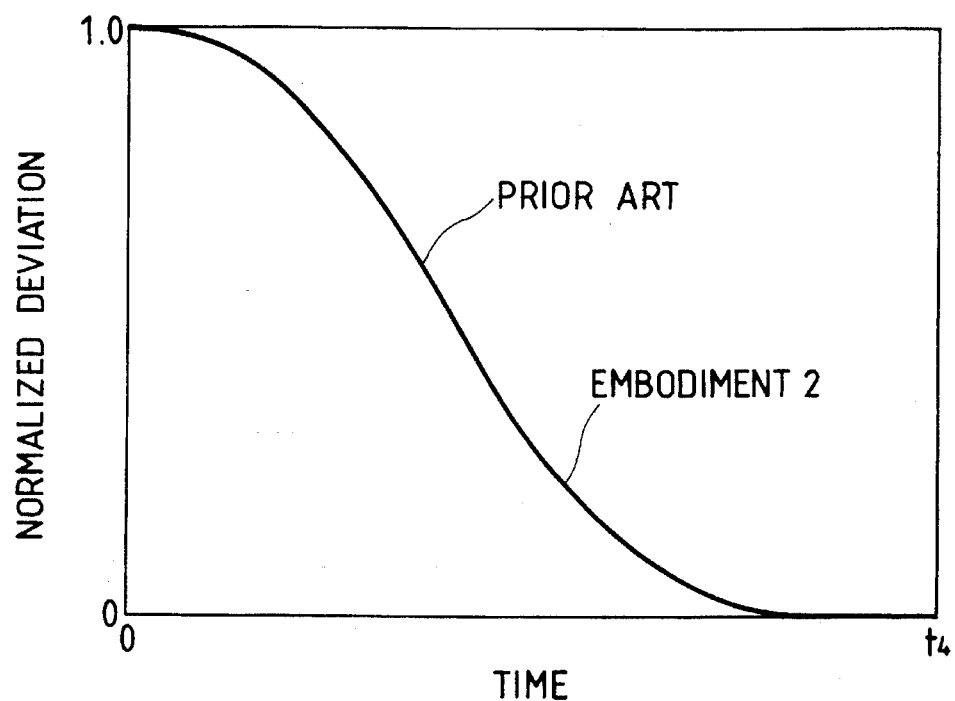
FIGS. 15A and 15B show the displacements of the stage when the stage is moved by a distance λ and precisely positioned at different times.
Figure 15B:
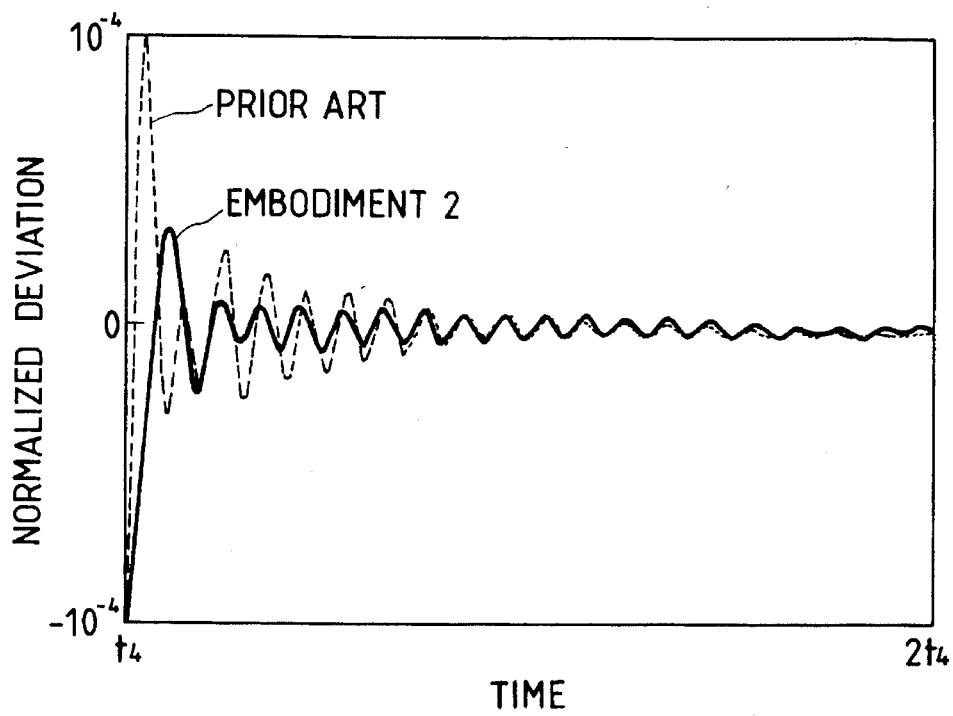

Further, the displacement of the stage when the stage 103 is actually moved by a predetermined distance $\lambda$ by the speed control mode and the position control mode and precisely positioned is shown in FIGS. 15A and 15B. FIG. 15A shows the state of response until time $t_4$ for the deviation to be settled in a certain predetermined range, and FIG. 15B shows the state of response from the time $t_4$ until time $2t_4$. In these figures, the vertical axes represent values normalized by the movement distance $\lambda$. The rough state of the response shown in FIG. 15A differs very little from that by the method using the prior-art base plate acceleration feedback, while the response in the minute positioning area of FIG. 15B differs entirely from that by the prior-art method, and the response according to the present embodiment is better in convergence than by the prior-art method. This is because according to the present embodiment, the suppressing characteristic for base plate acceleration vibration is improved as previously described. Accordingly, if positioning is effected by the present embodiment, shortened positioning time and improved positioning accuracy can be attained as compared with the prior-art method.

As described above, in a positioning apparatus carried on a base plate and having translation moving means and posture correcting means, provision is made of first control means for outputting a first command signal to translation driving means on the basis of the output from measuring means for the state of translation movement and a translation target value, third control means for posture control for outputting a command signal to posture driving means on the basis of the output from posture measuring means and a posture target value, and second control means, i.e., a so-called "disturbance observer", for calculating a disturbance to a stage on the basis of the output from the measuring means for the amount of state of translation movement and an input signal to the translation driving means and outputting a second command signal for negating the disturbance, and the first command signal and the second command signal are added together to provide an input signal to the translation driving means, whereby the vibration between the stage and a guide surface caused by the rolling of the base plate can be detected and eliminated as a "disturbance". At this time, the influence of the posture correcting means upon the disturbance observer can be eliminated by modifying means for the input of the amount of translation state of the disturbance observer using a control command value for the correction of the posture of the stage and/or the posture information from the posture measuring means, which modifying means is first modifying means, and/or modifying means for the output of the disturbance observer taking the dynamic characteristic of a posture correction control system into account, which modifying means is second modifying means.

What is claimed is:

1. A positioning apparatus comprising:

a table;

supporting means for dampingly supporting said table;

a movable member movable on said table;

guiding means provided on said table for guiding motion of, without touching, said movable member on said table;

driving means, comprising a linear motor provided on said table, for causing said movable member to move on said table according to a drive signal;

measuring means, comprising a laser interferometer provided on said table, for measuring a displacement of said movable member on said table and for producing a measurement signal;

signal outputting means for outputting a target signal corresponding to a target position for positioning said movable member on said table;

first controlling means for outputting a first command signal for positioning said movable member at the target position, based on the measurement signal and the target signal; and second controlling means for estimating a disturbance disturbing said movable member being moved on said table by said driving means, based on the drive signal and the measurement signal and for outputting a second command signal for cancelling an affect of the estimated disturbance, wherein the second command signal is added to the first command signal when the first command signal is output as the drive signal.

2. A positioning apparatus according to claim 1, wherein said first controlling means comprises a velocity controlling apparatus for controlling velocity of said movable member and a position controlling apparatus for controlling a position of said movable member, wherein the first command signal is output from said velocity controlling apparatus until a difference between the measurement signal and a reference signal reaches a predetermined value, and thereafter the first command signal is output from said position controlling apparatus.

3. A positioning apparatus according to claim 1, wherein said second controlling means comprises a differentiator for differentiating the measurement signal for obtaining a moving velocity of said movable member.

4. A positioning apparatus comprising:

a table;

supporting means for dampingly supporting said table;

a coarse movement stage moving on said table;

guiding means provided on said table for guiding motion of, without touching, said coarse movement stage on said table;

driving means, comprising a linear motor provided on said table, for causing said coarse movement stage to move on said table according to a drive signal;

positions measuring means, comprising a laser interferometer provided on said table, for measuring a displacement of said coarse movement stage on said table and for producing a position measurement signal;

signal outputting means for outputting a target signal corresponding to a target position for positioning said coarse movement stage on said table;

a fine movement stage supported on said coarse movement stage;

posture measurement means for measuring a posture of said fine movement stage on said coarse stage and for producing a posture measurement signal;

posture adjusting means for adjusting a posture of said fine movement stage on said coarse movement stage based on the posture adjustment signal;

first controlling means for outputting a first command signal for positioning said coarse movement stage at the target position based on the target signal and the position measurement signal; and second controlling means for estimating a disturbance disturbing said coarse movement stage being moved on said table by said driving means, based on the drive signal and the position measurement signal, and for outputting a second command signal for cancelling an affect of the estimated disturbance, wherein the second command signal is added to the first command signal when the first command signal is output as the drive signal, in which the second command signal is corrected based on at least one of the posture measurement signal and the posture adjustment signal.

5. A positioning apparatus according to claim 4, wherein said first controlling means comprises a velocity controlling apparatus for controlling velocity of said movable member and a position controlling apparatus for controlling a position of said movable member, wherein the first command signal is output from said velocity controlling apparatus until a difference between the measurement signal and a reference signal reaches a predetermined value, and thereafter the first command signal is output from said position controlling apparatus.

6. A positioning apparatus according to claim 5, wherein said second controlling means comprises a differentiator for differentiating the measurement signal for obtaining a moving velocity of said movable member.

* * * * *

UNITED STATES PATENT AND TRADEMARK OFFICE
CERTIFICATE OF CORRECTION

PATENT NO. : 5,511,930  Page 1 of 4
DATED : April 30, 1996
INVENTOR(S) : Mikio SATO, et al.

It is certified that error appears in the above-indentified patent and that said Letters Patent is hereby corrected as shown below:

ON THE COVER PAGE

Under "U.S. PATENT DOCUMENTS":

"3,692,413  4/1972  Marcy et al."
should read
--3,692,413  9/1972  Marcy et al.--; and "5,062,712  11/1991  Sokuta et al."
should read
--5,062,712  11/1991  Sakuta et al.--.

Under "FOREIGN PATENT DOCUMENTS":

"2155252  6/1990  Japan
 4139854  5/1992  Japan"
should read
--2-155252  6/1990  Japan
  4-139854  5/1992  Japan--.

UNITED STATES PATENT AND TRADEMARK OFFICE
CERTIFICATE OF CORRECTION

PATENT NO. : 5,511,930
DATED : April 30, 1996
INVENTOR(S) : Mikio SATO, et al.

It is certified that error appears in the above-indentified patent and that said Letters Patent is hereby corrected as shown below:

In the "ABSTRACT," item [57]

Line 7, "rigidityy" should read --rigidity--.

COLUMN 2:

Line 19, "of-said" should read --of said--.

COLUMN 3:

Line 34, "vatue" should read --value--.

COLUMN 5:

Line 65, "$x_{r}$," should read --x,--.

UNITED STATES PATENT AND TRADEMARK OFFICE
CERTIFICATE OF CORRECTION

PATENT NO. : 5,511,930     Page 3 of 4
DATED : April 30, 1996
INVENTOR(S) : Mikio SATO, et al.

It is certified that error appears in the above-indentified patent and that said Letters Patent is hereby corrected as shown below:

COLUMN 6:

Line 18,
$$"L(s)=S^2+g_1s+g_2 \qquad (5)"$$
should read
$$--L(s)=s^2+g_1s+g_2 \qquad (5)--; \text{ and}$$

Line 46, "water" should read --wafer--.

COLUMN 9:

Line 12, "period" should read --period,--.

COLUMN 12:

Line 17, "$u_L$" should read --$u_L$.--.

UNITED STATES PATENT AND TRADEMARK OFFICE
CERTIFICATE OF CORRECTION

PATENT NO. : 5,511,930
DATED : April 30, 1996
INVENTOR(S) : Mikio SATO, et al.

It is certified that error appears in the above-indentified patent and that said Letters Patent is hereby corrected as shown below:

COLUMN 15:

Line 32, "affect" should read --effect--.

COLUMN 16:

Line 7, "positions" should read --position--;
Line 33, "affect" should read --effect--; and
Line 50, "claim 5," should read --claim 4,--.

Signed and Sealed this

Twenty-sixth Day of November 1996

Attest:

BRUCE LEHMAN

Attesting Officer     Commissioner of Patents and Trademarks